United States Patent
Khu

(10) Patent No.: US 7,685,380 B1
(45) Date of Patent: Mar. 23, 2010

(54) METHOD FOR USING CONFIGURATION MEMORY FOR DATA STORAGE AND READ OPERATIONS

(75) Inventor: Arthur H. Khu, San Mateo, CA (US)

(73) Assignee: XILINX, Inc., San Jose, CA (US)

( * ) Notice: Subject to any disclaimer, the term of this patent is extended or adjusted under 35 U.S.C. 154(b) by 454 days.

(21) Appl. No.: 11/169,462

(22) Filed: Jun. 29, 2005

(51) Int. Cl.
*G06F 12/00* (2006.01)

(52) U.S. Cl. .................. 711/156; 711/102; 711/103; 714/726; 714/727

(58) Field of Classification Search .................. None
See application file for complete search history.

(56) References Cited

U.S. PATENT DOCUMENTS

| | | | |
|---|---|---|---|
| 6,466,049 B1 | 10/2002 | Diba et al. | |
| 6,487,710 B1 | 11/2002 | Marquez | |
| 6,560,665 B1 | 5/2003 | Resler et al. | |
| 6,995,584 B1 | 2/2006 | Nguyen et al. | |
| 2001/0054129 A1* | 12/2001 | Wouters | 711/103 |
| 2002/0184436 A1* | 12/2002 | Kim et al. | 711/103 |
| 2006/0041801 A1* | 2/2006 | Krause et al. | 714/724 |

OTHER PUBLICATIONS

Winn L. Rosch, Hardware Bible, 2003, 6th edition, Chapter 16, section 3.*

Altera Corporation; "Serial Configuration Devices Advanced Features", 2 pages, available from Altera Corporation, 101 Innovation Drive, San Jose, California 95134, USA or at http:/ /altera.com/ products/devices/serialcfg/features/scg-adv_features.html.

Xilinx, Inc., "CoolRunner-II CPLD Family", Product Specification, DS090, Jun. 28, 2005, (v2.5), pp. 1-14, available from Xilinx, Inc., 2100 Logic Drive, San Jose, CA 95124.

Xilinx, Inc., "CoolRunner XPLA3 CPLD", Product Specification, DS012, Apr. 8, 2005, (v2.1), pp. 1-12, available from Xilinx, Inc., 2100 Logic Drive, San Jose, CA 95124.

Xilinx, Inc., "XC9500 In-System Programmable CPLD Family", Product Specification, DS063, Apr. 15, 2005, (v5.3), pp. 1-16, available from Xilinx, Inc., 2100 Logic Drive, San Jose, CA 95124.

(Continued)

*Primary Examiner*—Christian P Chace
*Assistant Examiner*—Alan Otto
(74) *Attorney, Agent, or Firm*—William L. Paradice, III; LeRoy D. Maunu

(57) ABSTRACT

Individual storage locations in a PROM that stores a configuration file for a PLD may be directly addressed so that selected portions of the data stored therein may be replaced or updated with new data without having to erase all the contents of the PROM, reprogram the PROM with a new configuration file, and/or reconfigure the FPGA with the new configuration file. For some embodiments, a PROM includes a JTAG-compatible interface that is coupled to a JTAG-compatible test circuit provided within the PLD, and circuit within the PLD is configured to directly address individual storage locations in the PROM via the PROM's JTAG interface using well-known JTAG commands.

20 Claims, 7 Drawing Sheets

OTHER PUBLICATIONS

Xilinx, Inc., "XC9500XL High-Performance CPLD Family Data Sheet", Product Specification, DS054, Jul. 15, 2005, (v.2.0), pp. 1-17, available from Xilinx, Inc., 2100 Logic Drive, San Jose, CA 95124.

Xilinx, Inc., "XC9500XV Family High-Performance CPLD", Product Specification, DS049, Apr. 15, 2005, (v.2.2), pp. 1-18 available from Xilinx, Inc., 2100 Logic Drive, San Jose, CA 95124.

Xilinx, Inc., "Virtex-II Platform FPGAs: Complete Data Sheet", Product Specification, DS031, Mar. 1, 2005, (v3.4), pp. 1-318, available from Xilinx, Inc., 2100 Logic Drive, San Jose, CA 95124.

Xilinx, Inc., "Spartan-3E FPGA Family: Complete Data Sheet", Product Specification, DS312, Mar. 21, 2005, (v1.1) pp. 1-193, available from Xilinx, Inc., 2100 Logic Drive, San Jose, CA 95124.

U.S. Appl. No. 11/216,299, filed Aug. 5, 2005, Lakkapragada, Shankar et al., Xilinx, Inc., 2100 Logic Drive, San Jose, CA 95124.

Khu, Arthur, et al., "Using Xilinx XCF02S/XCF04S JTAG PROMs for Data Storage Applications", XAPP544 (v1.0) Jul. 20, 2005, pp. 1-6, Xilinx, Inc., 2100 Logic Drive, San Jose, CA 95124.

* cited by examiner

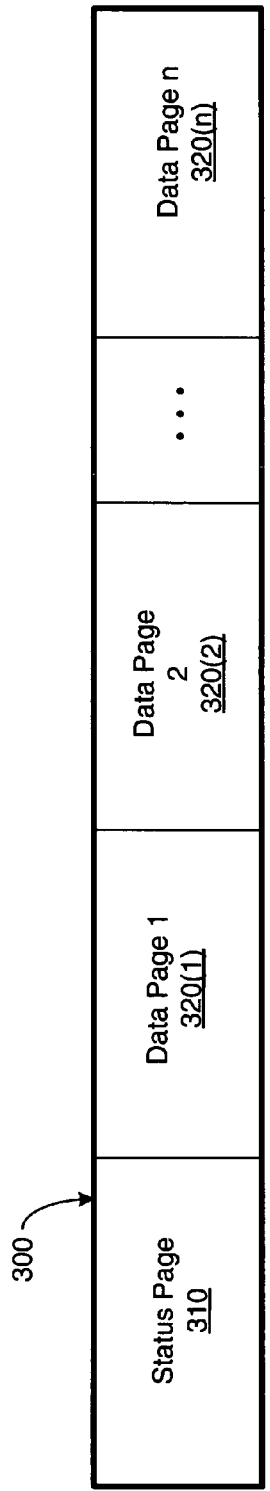
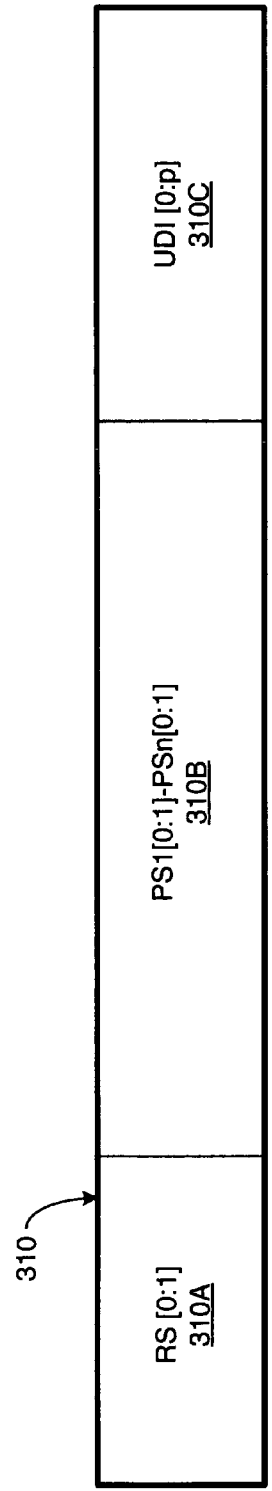
FIG. 3A
FIG. 3B

METHOD FOR USING CONFIGURATION MEMORY FOR DATA STORAGE AND READ OPERATIONS

FIELD OF INVENTION

This invention relates generally to operation of a configurable device, and in particular to updating and controlling an external memory coupled to the configurable device.

DESCRIPTION OF RELATED ART

A configurable integrated circuit (IC) is an integrated circuit including various configurable resources. A programmable logic device (PLD) is a well-known type of configurable IC that can be programmed by a user to implement a variety of selected functions. PLDs are becoming increasingly popular with circuit designers because they require less time to design than custom-designed integrated circuits such as Application Specific Integrated Circuits (ASICs).

There are many types of PLDs such as Field Programmable Gate Arrays (FPGAs) and complex PLDs (CPLDs). For example, an FPGA typically includes a plurality of configurable logic blocks (CLBs), input/output blocks (IOBs), and block RAM selectively connected to each other to implement complex user designs by a programmable interconnect structure. The CLBs are individually programmable and can be configured to perform a variety of logic functions. The IOBs are selectively connected to various I/O pins of the FPGA, and can be configured, for example, as either input buffers or output buffers. The block RAMs can store data during operation of the FPGA and/or can be configured to implement various functions such as FIFO memories and state machines. The various functions and signal interconnections implemented by the CLBs, IOBs, and the programmable interconnect structure are controlled by a number of corresponding configuration memory cells that store configuration data embodying a desired user design. An FPGA may include other types of configurable resources, such as multipliers, processors, transceivers, DSP blocks, clock managers, etc.

Further, some of the CLBs may be programmed as a "soft" controller or processor, such as the MicroBlaze™ soft processor core available from Xilinx Inc., which is the assignee of the present invention. As known in the art, a soft controller, such the MicroBlaze™ soft processor core, may be used to perform functions normally performed by a dedicated (e.g., hardwired) processor, such as executing software code and instructions, thereby providing additional functionality. Of course, some FPGAs may additionally or alternatively include one or more dedicated microprocessors for executing software code and instructions.

To configure a PLD such as an FPGA that has an internal or embedded microcontroller (e.g., a hardwired processor or a soft processor), a configuration file is typically loaded from an external Programmable Read Only Memory (PROM) into the FPGA during a well-known configuration operation. The configuration file typically includes configuration data to be loaded into the configuration memory cells that control the states of various configurable elements (e.g., switches, multiplexers, and the like) within the CLBs, IOBs, and the programmable interconnect structure. The configuration file may also include soft data such as firmware code, software programs, and other instructions executable by the programmable device's hard and/or soft controller, and may be loaded into block RAM and/or into other memory elements accessible by the FPGA's embedded controller.

As mentioned above, the configuration file for a PLD such as an FPGA is typically stored in an external PROM. As known in the art, many existing PROMs are erased using a chip erase function that erases the entire contents of the PROM. Further, most PROMs do not allow their storage locations to be individually addressed using standard I/O ports. As a result, after the PROM is programmed with a configuration file, if a user later desires to replace selected portions of the data stored in the PROM with new data, for example, to update the firmware code for the FPGA's controller, the user must erase all the data stored in the PROM using a chip-erase function, and then reprogram the PROM with a new configuration file that contains the replaced (e.g., new) data. Thereafter, the FPGA may be reconfigured using the new configuration file stored in the PROM during a subsequent configuration operation.

Unfortunately, erasing all the contents in the PROM and then reprogramming the PROM with a new configuration file is a time-consuming process, which is not only inconvenient but also may be infeasible for some applications in which the FPGA is already deployed. Further, because the FPGA must be reconfigured with the new configuration file, the FPGA is susceptible to configuration errors resulting from possible interruptions in the PROM programming operation and/or in the FPGA reconfiguration operation, which is undesirable. In addition, if portions of the updated data contained in the new configuration file are later discovered to contain errors (e.g., such as software glitches or bugs in the processor's firmware code), the PROM must be erased and reprogrammed with yet another configuration file, which in turn must be loaded into the FPGA during yet another configuration operation.

Although using a non-volatile memory such as an EEPROM or flash memory device that allows its storage locations to be directly addressed may alleviate the above-mentioned problems, such other non-volatile memory devices are more expensive than PROMs. Further, after an FPGA and its associated PROM are deployed in a user application, replacing the PROM with an EEPROM or flash memory device may not be feasible.

Thus, there is a need for providing direct access to individual storage locations in a PROM that stores a configuration file for an FPGA so that selected portions of the data stored therein may be replaced or updated with new data without having to erase all the contents of the PROM, reprogram the PROM with a new configuration file, and then reconfigure the FPGA with the new configuration file.

SUMMARY

A method and apparatus are disclosed that allow individual storage locations in a memory that stores configuration information for a configurable device to be directly addressed so that selected portions of the data stored therein may be replaced or updated with new data without having to erase all the contents of the memory and without having to reprogram the memory with a new configuration file. In accordance with embodiments of the present invention, a system includes the memory and the configurable device. The configurable device includes a controller that may directly access individual storage locations in the memory and that may read data from and/or write data to the memory.

For some embodiments, one or more rows in the memory includes a status page. The status page may include status bits, where the status bits indicate whether storage locations within the memory contains valid data or contains stale data. When data is programmed into the memory, a first bit in each of the corresponding status bit sets may be programmed to indicate that corresponding data is valid. Subsequently, if a user desires to update existing data with new data, a second bit in each of the status bit sets associated with the existing data may be programmed to indicate that the existing data is stale.

For example, the memory may initially be programmed with data that implements a desired user design and that implements the controller using configurable resources of the configurable device. The memory may also contain user data such as firmware code for the controller. If a user later desires to update a selected portion of the data stored in the memory, the controller may access individual storage locations in the memory to program the new data into available storage locations in the memory. When the new data is written into the memory, selected portions of the existing data to be replaced by the new data are marked as stale, and the new data is marked as valid. By allowing selected portions of data to be updated in the memory, embodiments of the present invention may be used to update selected portions of data stored in the memory without having to erase all the contents of the memory, and without having to reprogram the memory with a new configuration bitstream, thereby saving time and reducing susceptibility to configuration errors, for example, caused by interruptions in the memory programming operation and/or in configurable device reconfiguration operations. In addition, because previous versions of the data stored in the memory are not erased, embodiments of the present invention may be used to retrieve previous versions of data from the memory, which may be advantageous, for example, if the new or updated data is later discovered to contain erroneous data.

BRIEF DESCRIPTION OF THE DRAWINGS

The features and advantages of the present invention are illustrated by way of example and are by no means intended to limit the scope of the present invention to the particular embodiments shown, and in which:

FIG. 3A is a block diagram illustrating an exemplary row of the PROM of FIG. 2 as having a plurality of pages configured in accordance with some embodiments of the present invention;

FIG. 3B is a block diagram illustrating an exemplary status page of the row of FIG. 3A in accordance with some embodiments of the present invention;

Like reference numerals refer to corresponding parts throughout the drawing figures.

DETAILED DESCRIPTION

Embodiments of the present invention are described below with respect to an exemplary FPGA architecture that is generally representative of the Virtex-II Pro™ family of FPGA devices from Xilinx, Inc. for simplicity only. It is to be understood that embodiments of the present invention are equally applicable to other configurable devices such as various FPGA architectures (e.g., the Virtex™-4 family of FPGA devices from Xilinx, Inc.) and to other integrated circuits (ICs) having configurable resources, including programmable logic devices such as complex PLDs. In the following description, for purposes of explanation, specific nomenclature is set forth to provide a thorough understanding of the present invention. In other instances, well-known circuits and devices are shown in block diagram form to avoid obscuring the present invention. Further, the logic levels assigned to various signals in the description below are arbitrary and, thus may be modified (e.g., reversed polarity) as desired. Accordingly, the present invention is not to be construed as limited to specific examples described herein but rather includes within its scope all embodiments defined by the appended claims.

Figure 1:
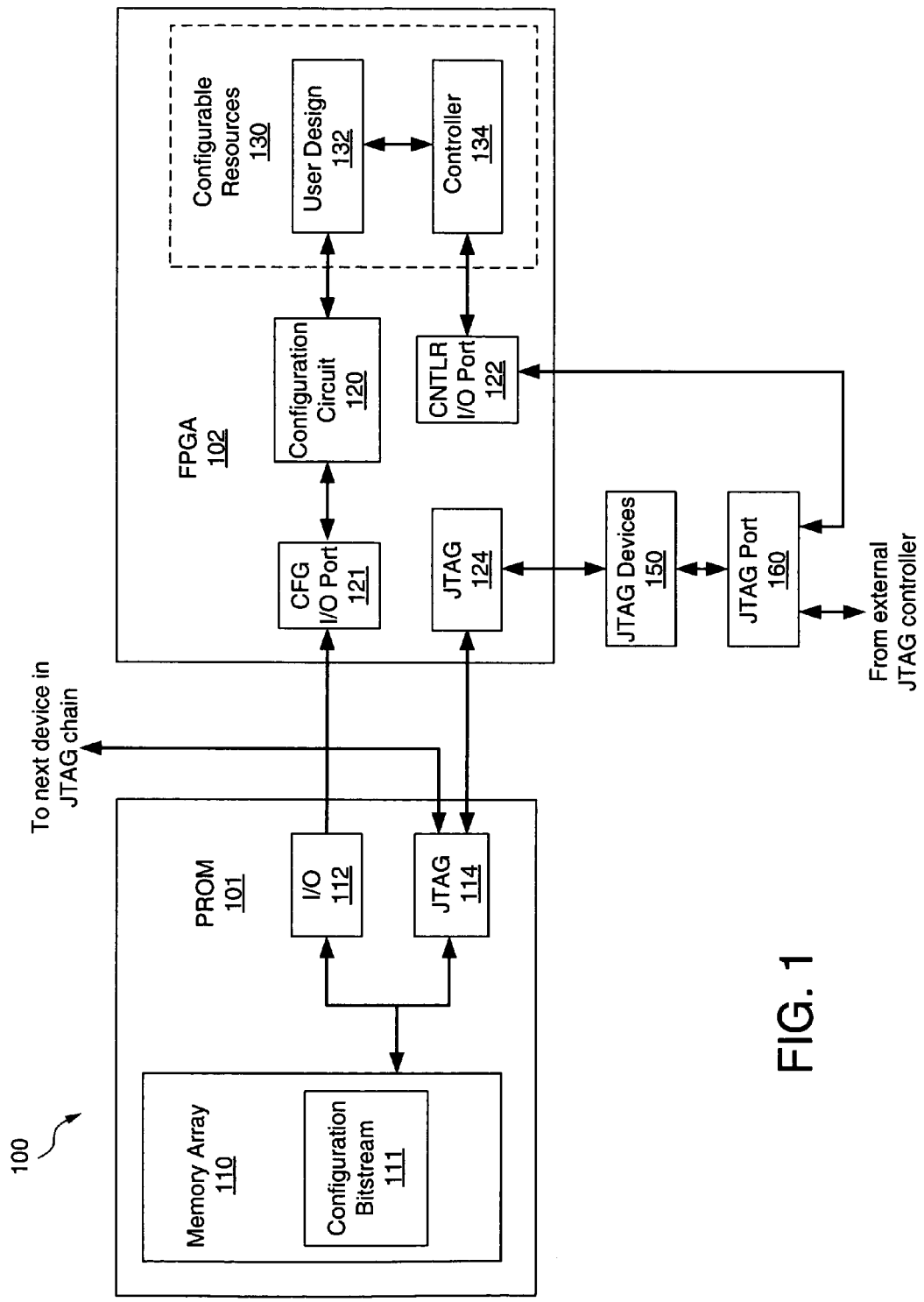
FIG. 1 is an exemplary block diagram of system having a PROM connected to an FPGA in accordance with some embodiments of the present invention.

FIG. 1 is a functional block diagram of a programmable system 100 in accordance with some embodiments of the present invention. System 100 includes a programmable read-only memory (PROM) 101, an FPGA device 102, one or more JTAG devices 150, and a JTAG port 160 connected together in a single boundary scan chain. JTAG devices 150, which may include any number of IC devices or chips (e.g., other programmable devices similar to FPGA 102), are coupled between FPGA 102 and JTAG port 160. For other embodiments, JTAG devices 150 may be omitted from the scan chain. JTAG port 160 is a well-known system-level port that allows an external controller (not shown in FIG. 1 for simplicity) to perform boundary scan test operations on system 100 using well-known JTAG command sets, for example, as defined by the well-known JTAG standard embodied by IEEE standard 1149.1.

PROM 101, which may be of a well-known architecture, includes a memory array 110, an input/output (I/O) port 112, and a JTAG circuit 114. Memory array 110, which may include any number of rows each having any number of memory cells, may be used to store a configuration bitstream 111 for FPGA 102. For simplicity, individual rows of memory cells of memory array 110 are not shown in FIG. 2. Note that the rows merely correspond to a logical organization of memory array 110, and in general, as used herein, a row may be any arbitrary sub-block of memory array 110. I/O port 112, which is well-known, is coupled to memory array 110 and may be used to output configuration data from memory array 110 to FPGA 102 during configuration of FPGA 102. For some embodiments, I/O port 112 may transfer data from memory array 110 to FPGA 102 using various well-known serial and/or parallel data transfer modes, such as those utilized with the Virtex family of products from Xilinx, Inc, although other data transfer protocols may be used. JTAG circuit 114, which is well-known, is coupled to memory array 110, to FPGA 102, and to the next device (not shown for simplicity) in the boundary scan chain. As known in the art, JTAG circuit 114 may be used for testing the various internal resources of PROM 101 using well-known boundary scan techniques. For some embodiments, JTAG circuit 114 may be used to initially program configuration bitstream 111 into memory array 110 using well-known JTAG commands, for example, provided by a host system (not shown for simplicity). For other embodiments, I/O port 112 may be used to initially program configuration data into the PROM's memory array 110 from the host system.

FPGA 102 is shown to include a configuration circuit 120, a configuration (CFG) I/O port 121, a controller (CNTLR) I/O Port 122, a JTAG circuit 124, and configurable resources 130. Other well-known components of FPGA 102 are not shown in FIG. 1 for simplicity. Configuration circuit 120 is coupled to the PROM's I/O port 112 via configuration I/O port 121, and is also coupled to configurable resources 130. Configuration circuit 120, which is well-known, may be used to load configuration data provided from PROM 101 to FPGA 102, for example, during an initial configuration operation of FPGA 102. Configuration I/O port 121 facilitates the transfer of data from PROM 101 to FPGA 102 during the initial configuration operation, and may also be used after initial configuration to transfer data between PROM 101 and FPGA 102. Controller I/O port 122 is coupled to configurable resources 130 and to a first input of system-level JTAG port 160. In some embodiments, controller I/O port 122 may be connected directly to JTAG circuit 114.

Configuration I/O port 121 and controller I/O port 122 may be formed using well-known circuitry. For some embodiments, configuration I/O port 121 and/or controller I/O port 122 may be dedicated I/O ports. For other embodiments, configuration I/O port 121 and/or controller I/O port 122 may be non-dedicated I/O ports, for example, that may be used for other purposes (e.g., a user-defined I/O port) after FPGA 102 has been configured. JTAG circuit 124, which is well-known, is coupled to the PROM's JTAG circuit 114 and to JTAG devices 150.

Configurable resources 130 are generally representative of various well-known configurable resources such as, for example, the CLBs, IOBs, block RAMs, multipliers, processors, transceivers, DSP blocks, clock managers, and/or the programmable interconnect structure typically provided within programmable devices such as FPGA 102, as well as the configuration memory cells that store the configuration information for the various routing and logic functions implemented by the configurable resources 130. For the exemplary embodiment of FIG. 1, configurable resources 130 are shown to implement a user design 132 and a soft controller 134. The user design 132 implements a desired circuit design embodied by configuration data contained in the configuration bitstream 111. Controller 134, which may be implemented by programming some of the configurable resources 130 with configuration data contained in the configuration bitstream 111, may emulate various functions performed by a hardwired microprocessor, for example, to execute various software programs, instruction sets, micro-codes, and the like. In some embodiments, controller 134 may be integral with user design 132. For some embodiments, controller 134 may be implemented as Xilinx Inc.'s MicroBlaze controller. However, for other embodiments, controller 134 may implement other well-known soft controllers or processors.

In accordance with the present invention, controller 134 may be used to directly address individual storage locations in the PROM array 110 using well-known JTAG commands after configuration of FPGA 102, which as explained in more detail below may allow selected portions of data stored in PROM memory array 110 to be effectively replaced with new data (e.g., by controller 134) without having to erase all the contents in the PROM memory array 110 and without having to reprogram the PROM memory array 110 with a new configuration bitstream. In some embodiments, controller 134 may access PROM memory array 110 through interfaces other than JTAG, such as a serial (e.g., SPI) or parallel interface. Further, although described below in the context of soft controller 134, embodiments of the present invention are equally applicable to hardwired processors. Indeed, for other embodiments, FPGA 102 may also include a dedicated microprocessor (not shown for simplicity) such as the well-known PowerPC processor core available from IBM Corporation.

As mentioned above, the system-level JTAG port 160 may be connected to an external controller (not shown for simplicity) via a second input to test the internal resources of various devices within system 100 using well-known boundary scan techniques. During boundary scan test operations, controller I/O port 122 may tri-state its pins (e.g., which are connected to the first input of JTAG port 160) so that the external controller may perform boundary scan test operations of the various components of system 100, for example, by providing test vectors and associated JTAG command sets to the second input of JTAG port 160. Thereafter, the external controller may tri-state its signal connections to JTAG port 160 so that the FPGA's controller 134 may access the boundary scan chain via controller I/O port 122, which as described in more detail below may allow controller 134 to directly access individual storage locations in the PROM's memory array 110 using JTAG commands. Note that in some embodiments, controller 134 may be directly connected to PROM 101 to access PROM memory array 110 using JTAG or other interfaces, with appropriate tri-state controls to prevent contention.

Figure 2:
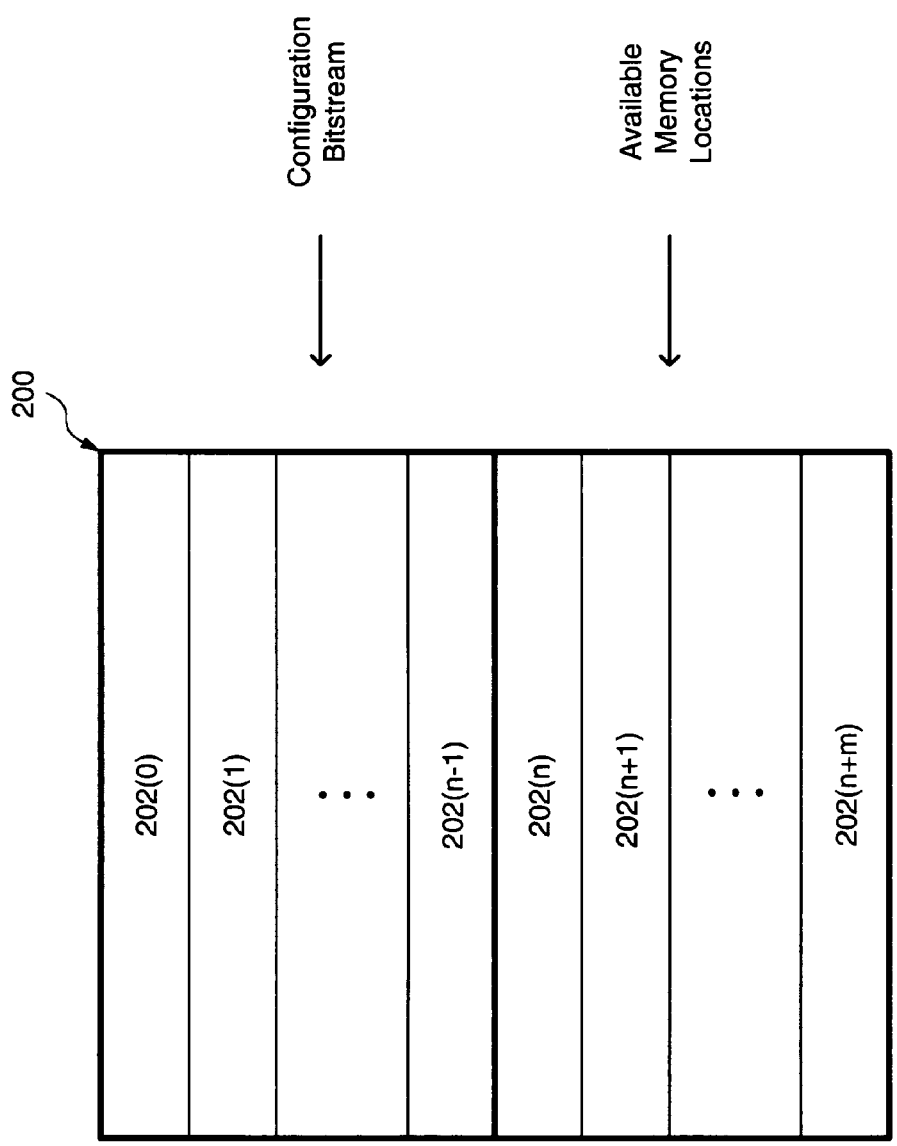
FIG. 2 is a block diagram of the PROM of FIG. 1 configured in accordance with an exemplary embodiment of the present invention.

FIG. 2 is a block diagram of a memory array 200 that is one embodiment of the PROM memory array 110 of FIG. 1. Memory array 200 includes a plurality of rows 202(0)-202(n+m), each of which may include a suitable number of memory cells (not shown in FIG. 2 for simplicity). For exemplary embodiments described herein, a configuration bitstream (e.g., configuration bitstream 111 of FIG. 1) may be initially programmed into a first set of n rows 202(0)-202(n−1) of memory array 200 (e.g., by a host system) in a well-known manner, thereby leaving a second set of rows 202(n)-202(n+m) of memory array 200 available for subsequently storing additional data. Thus, after initial configuration of FPGA 102, controller 134 may be used to store additional data into rows 202(n)-202(n+m) of the PROM's memory array 200 using well-known JTAG commands, for example, to add or to effectively replace selected portions of the user data stored in memory array 200 without erasing the selected portions of the user data from memory array 200.

FIG. 3A shows a row 300 that is one embodiment of one or more rows 202 of memory array 200 of FIG. 2. Row 300 includes a status page 310 and a plurality of data pages 320(1)-320(n), where each of the data pages 320(1)-320(n) may be used to store data (e.g., user data for controller 134 or data used by other parts of FPGA 102), and status page 310 may be used to store status information for data stored in the row and/or in the various data pages 320 of row 300. Row 300 may include any number of data pages 320(1)-320(n), which in turn may each include any number of memory cells, and status page 310 may include any number of memory cells. For one exemplary embodiment, row 300 includes thirty-two 128-bit data pages 320(1)-320(32), and includes one status page 310 for storing at least one status bit set for each corresponding data page 320. Note that a page may have any arbitrary size, and the size of pages need not be identical.

FIG. 3B shows one embodiment of status page 310 as having three fields 310A-310C. The first field 310A stores two row status bits RS[0:1] that may be used to indicate the row status, such as whether row 300 is available (e.g., to store new data), whether row 300 contains valid data, or whether row 300 contains stale data. The second field 310B stores a number of page status bit sets PS1[0:1]-PSn[0:1], each of which includes two bits that may be used to indicate page status, such as whether a corresponding data page 320 of the row is available, stores valid data, or stores stale data. The third field 310C stores a number of user-defined information bits UDI[0:p] that may be used to store other status information for data stored in the PROM array 110. For example, the user-defined information bits UDI[0:p] may be used to indicate what type of data is stored in the row (e.g., configuration data, user data, and so on), how many rows in the PROM's memory array are used and/or available, which version of data is stored in the row, the start and end addresses for various data sets stored in memory array 200, the start address (SA) of user data stored in memory array 200, and so on. For other embodiments, one or more of the status fields within status page 310 may be omitted.

For some exemplary embodiments described herein, a first subset of the rows 202(0)-202(n−1) of memory array 200 may be designated to store configuration data for FPGA 102, and a second subset of the rows 202(0)-202(n−1) of memory array 200 may be designated to store user data such as firmware code for controller 134. For such embodiments, the first page 310 in each row 300 of the second subset of the rows 202(0)-202(n−1), as well as the first page 310 of each available row 202(n)-202(n+m), may be used to store row and/or page status bit sets, for example, as described above with respect to FIGS. 3A and 3B, and the first page 310 in each row of the first subset of the rows 202(0)-202(n−1) may be used to store configuration data (e.g., rather than to store status information). In this manner, configuration data may be stored in consecutive storage locations in the PROM memory array 200 so that during subsequent FPGA configuration operations the PROM may provide a bitstream that contains only configuration data to the FPGA's configuration circuit 120, which may be desirable for some FPGA products that may not be capable of distinguishing between status information and configuration data.

However, for other embodiments, every row 202 of PROM memory array 200 may include a status page 310 for storing status information for the row. Thus, for such other embodiments, the first page 310 in each row 200 of the first subset of the rows may be used to store row and/or status bit sets for the row, for example, in a manner similar to that described above with respect to FIGS. 3A and 3B. In this manner, selected portions of the configuration data stored in memory array 200 may be "replaced" by controller 134 with new data to be stored in available rows 202(n)-202(n+m) in a manner similar to that described below with respect to FIGS. 4A-4C and 5. For other such embodiments, the FPGA's configuration circuit 120 may include logic (not shown for simplicity) that is capable of distinguishing between the status bit sets and configuration data provided to FPGA 102 during configuration operations.

For exemplary embodiments described herein, individual storage locations in PROM memory array 200 cannot be individually accessed using prior techniques, for example, using the PROM's I/O port 112 (see also FIG. 1). Thus, as known in the art, memory array 200 is typically erased using a chip-erase function that erases all the data stored therein. For some embodiments, memory array 200 may include a number of individually erasable sectors, each of which includes many rows of memory cells. However, for purposes of discussion herein, memory array 200 includes only one erasable sector encompassing the entire memory chip. Before memory array 200 is programmed with any data, all the memory cells in each of rows 202(0)-202(n+m) are initially in an erased (e.g., un-programmed) state, which for exemplary embodiments described herein corresponds to a logic high or "1" state. Thus, referring again to FIGS. 3A and 3B, prior to programming the PROM's memory array 200, the memory cells within data pages 320 of row 300 are initialized to the logic "1" state, and each bit of the row status bit set RS[0:1], the page status bit sets PS1[0:1]-PSn[0:1], and the user-defined information bits UDI[0:p] within the status page 310 of row 300 is initialized to the logic "1" state.

Figure 4A:
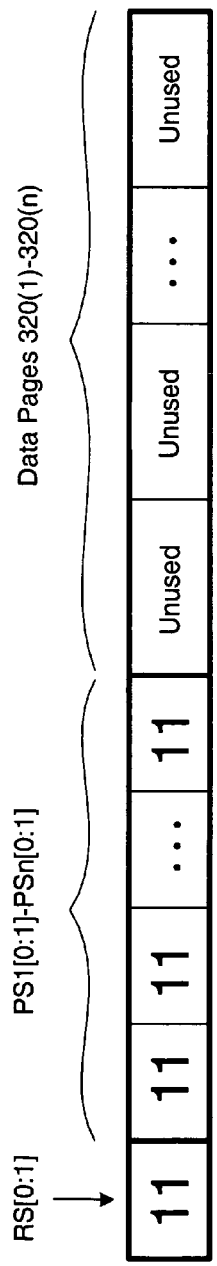
FIG. 4A is a block diagram depicting the row of FIG. 3A in its initial erased state in which all of the row's pages are not used.
Figure 4B:
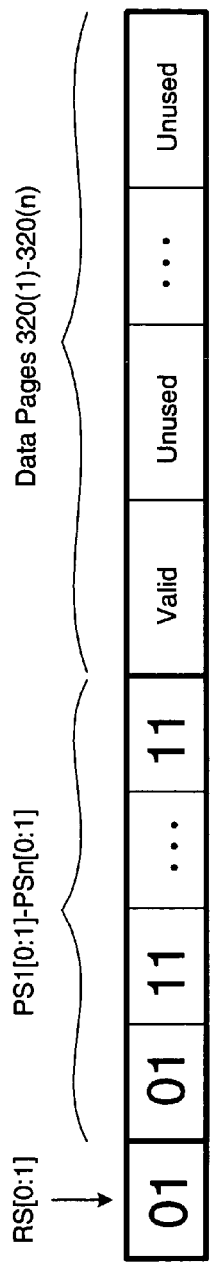
FIG. 4B is a block diagram showing the row of FIG. 3A as containing valid data.
Figure 4C:
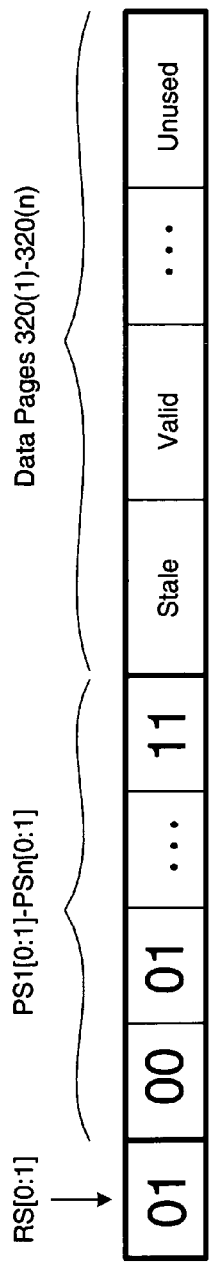
FIG. 4C is a block diagram showing the row of FIG. 3A as containing valid data and stale data.

In accordance with some embodiments of the present invention, the erased "11" state of the row status bit set RS[0:1] indicates that row 300 is unused and is thus available for storing data, and the erased "11" states of the page status bit sets PS1[0:1]-PSn[0:1] indicate that corresponding data pages 320(1)-320(n) of row 300 are unused and thus available for storing data, for example, as depicted in FIG. 4A. Then, when data is initially stored into row 300 (e.g., when configuration bitstream 111 is initially programmed into the PROM's memory array), the first row status bit RS[0] may be programmed to logic "0" so that RS[0:1] ="01" to indicate that valid data is stored in at least one page of the row, and the first page status bit PS[0:1] for each data page 320 that stores data may be programmed to logic "0" so that PS[0:1] ="01" to indicate that valid data is stored therein. For example, when data is initially programmed into the first data page 320(1) of row 300, RS[0:1] is programmed to "01" to indicate that valid data is stored in at least one data page of the row, and PS1[0:1] is programmed to "01" to indicate that valid data is stored in data page 320(1), as depicted in FIG. 4B. For the example depicted in FIG. 4B, the other page status bit sets PS2[0:1]-PSn[0:1] remain in their initial "11" states to indicate that corresponding data pages 320(2)-320(n) are unused. Subsequently, if a user desires to "replace" the data stored in first data page 320(1) with new data (e.g., to update firmware code for controller 134), the new data may be stored in the second data page 320(2) of the row, the second bit of PS1 may be programmed to logic "0" so that PS1[0:1]="00" to indicate that first data page 320(1) stores stale data, and the first bit of PS2 may be programmed to logic "0" so that PS2[0:1]="01" to indicate that second data page 320(2) stores valid data, for example, as depicted in FIG. 4C. Thereafter, controller 134 may retrieve the most recent version of data stored in the PROM memory array by reading only data marked as valid from the PROM's memory array (e.g., while skipping data marked as stale). In this manner, selected portions of the user data (e.g., data associated with controller 134) may be updated with new data without erasing the PROM memory array and without reprogramming the PROM memory array with a new configuration bitstream that includes the new data. In addition, because previous versions of the user data stored in the PROM memory array are not erased but rather are marked as stale, embodiments of the present invention may be used to retrieve previous versions of user data from the PROM, which may be advantageous, for example, if the new or updated data is later discovered to contain erroneous data.

Figure 5:
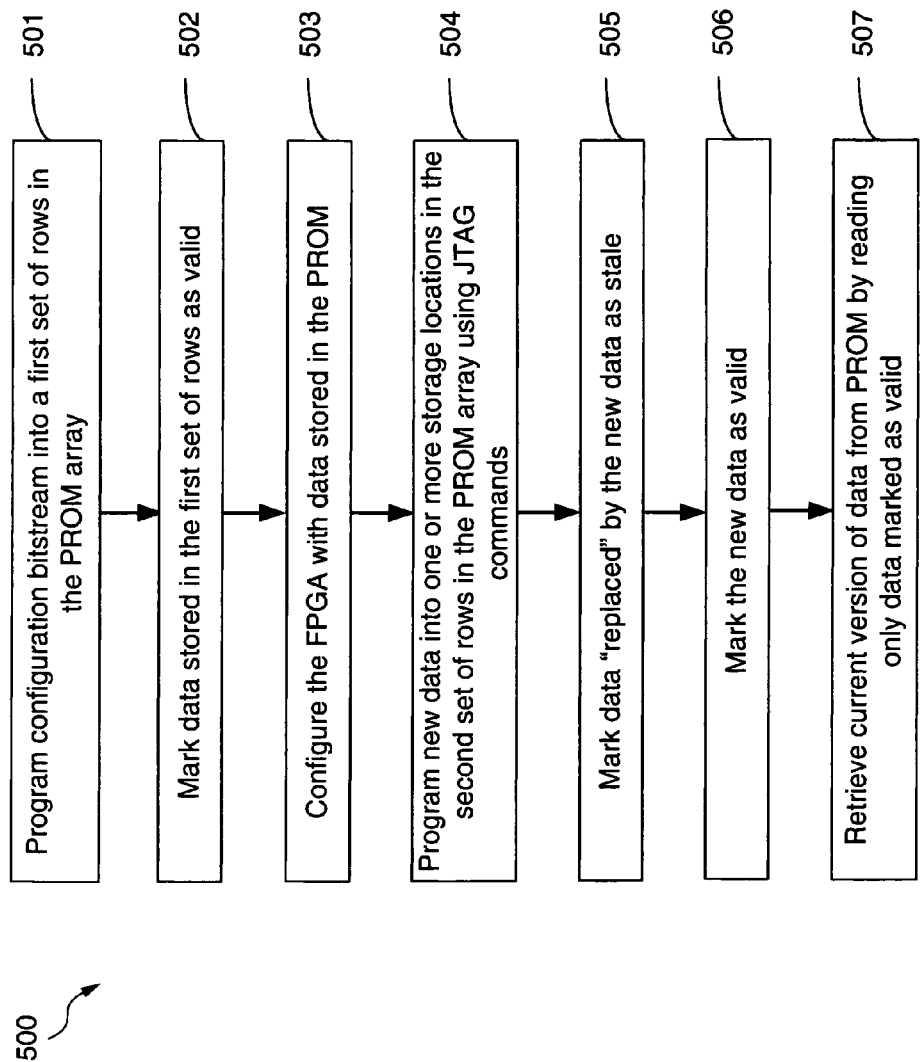
FIG. 5 is an illustrative flow chart depicting an exemplary operation of using the controller of the FPGA of FIG. 1 to write additional data to the PROM of FIG. 1 in accordance with some embodiments of the present invention.

FIG. 5 is an illustrative flow chart depicting an exemplary operation of one embodiment of the programmable system 100 of FIG. 1. Referring also to FIGS. 1, 2, and 3A-3B, all the memory cells in the PROM's memory array 200 are initially in erased (e.g., logic 1) states. Thus, prior to programming, the row status bit set RS[0:1] and the page status bit sets PS1[0:1]-PSn[0:1] in the status page 310 of each row 300 of the PROM's memory array 200 that stores user data are initialized to "11" states. Then, a user may program configuration bitstream 111 into a first set of rows 202(0)-202(n−1) of the PROM's memory array 200 in a well-known manner (step 501), and may mark the user data stored therein as valid (step 502). More specifically, for each row that stores valid user data, RS[0] may be programmed so that RS[0:1]="01" to indicate that at least one page of the row contains valid user data, and PS1[0]-PSn[0] may be programmed so that the page status bit sets PS1[0:1]-PSn[0:1]="01" to indicate that corresponding pages 320(1)-320(n) store valid user data.

Further, for some embodiments, the start address (SA) of the user data contained in the PROM memory array 200 may be stored in the UDI field 310C of the last row of memory array 200, which for this example is row 202(n+m), or any other predetermined location. For such embodiments, a well-known software utility tool may be used to determine how many storage locations in the PROM memory array are required to store the configuration bitstream 111, and thus determine the starting row address of the user data contained in the PROM memory array. In this manner, controller 134 may ascertain the start address of the user data by reading the start address from the UDI field of the last addressable row 202(n+m) in the memory array. For other embodiments, the start address of the user data may be stored in memory elements within FPGA 102 and accessible by controller 134.

Next, the configuration bitstream stored in the PROM memory array is provided to the FPGA's configuration circuit 120 via configuration port 121 and used to configure FPGA 102 in a well-known manner (step 503). For example, configuration data that embodies the user design 132 and/or controller 134 may be loaded into appropriate configuration memory cells within the FPGA's configurable resources 130. Once configured, controller 134 may utilize user data contained in the configuration bitstream to initialize itself to an operational state.

Thereafter, if a user desires to update selected portions of user data initially stored in one or more of the first set of rows 202(0)-202(n–1) with new data, controller 134 may be used, in accordance with the present invention, to program the new data into available storage locations in the second (e.g., unused) set of rows 202(n)-202(n+m) without erasing corresponding data stored in the first set of rows 202(0)-202(n–1) using JTAG commands (step 504). For example, referring also to FIG. 1, controller 134 may gain access to individual storage locations in the PROM memory array by using the boundary scan chain formed by PROM 101, FPGA 102, and JTAG devices 150. More specifically, controller 134 may send JTAG commands via controller port 122 to system-level JTAG port 160, which in turn routes the JTAG commands to the PROM memory array 110 through JTAG devices 150, the FPGA's JTAG circuit 124, and the PROM's JTAG circuit 114. These JTAG commands, which may place JTAG devices 150 and the FPGA's JTAG circuit 124 into a bypass mode, may be used to ascertain the next available storage location in the PROM memory array. For example, the controller 134 may first read the start address (SA) from the UDI field of the last addressable row 202(n+m), where as mentioned above SA indicates the starting address of the user data contained in the PROM memory array. Then, beginning with the row identified by SA, controller 134 examines the row's status bits to determine whether the row contains any available storage locations (e.g., data pages 320). If so, controller 134 may program the new user data into the available storage locations in the row. Otherwise, controller 134 increments SA and examines the next row's status bits to determine whether the next row contains available storage locations. This process is repeated until controller 134 finds the next available storage location for storing new user data, after which controller 134 programs the new user data into the identified available storage locations using JTAG commands provided through the boundary scan chain.

For other embodiments, the address of the next available storage location in the PROM memory array may be stored in memory elements within FPGA 102 and accessible by controller 134. For still other embodiments, controller 134 may program the address of the next available storage location of the PROM memory array into an available page in the PROM memory array, or in a special register or other storage location. In this manner, controller 134 does not need to search for the next available storage location in the PROM memory array, for example, by sequentially reading the status bits associated with the user data until an available page is identified in the manner described above.

Then, referring again to FIG. 5, portions of the user data stored in the PROM memory array that are selected for replacement by the new data are marked as stale (step 505), and the new data is marked as valid (step 506), for example, in the manner described above with respect to FIGS. 4A-4C. Thereafter, controller 134 may retrieve the most current version of user data stored in the PROM memory array by retrieving (e.g., using JTAG commands routed to PROM 101 via system 100's boundary scan chain, or through a direct connection, or other interface) only user data that is marked as valid, for example, by skipping user data that is marked as stale (step 507). As explained above, controller 134 may determine whether data is valid or stale by ascertaining the states of corresponding page status bit sets. This process may be repeated any number of times as long as there are available storage locations in the PROM memory array. Further, because the memory cells in the PROM memory array 110 cannot be individually erased, a page in a row that already contains data may be updated to store new data if each memory cell in the page either remains unchanged or is changed from an erased state to a programmed state. For such embodiments, controller 134 must compare the existing data with the new data to determine whether the page may be programmed to store the new data.

Because some PROMs that may be used to store a configuration bitstream for FPGA 102 may not have a write-protect feature, for some embodiments, one or more bytes in each row of the PROM memory array may be programmed with a special bit pattern that is checked for by controller 134 to prevent controller 134 from inadvertently writing new user data into rows that store configuration data for programming the FPGA's configurable resources 130 to a desired state.

Further, although described above as updating user data stored in the PROM memory array, embodiments of the present invention may also be used to update configuration data stored in the PROM memory array and that programs the FPGA's configurable resources 130 to a desired state.

Figure 6:
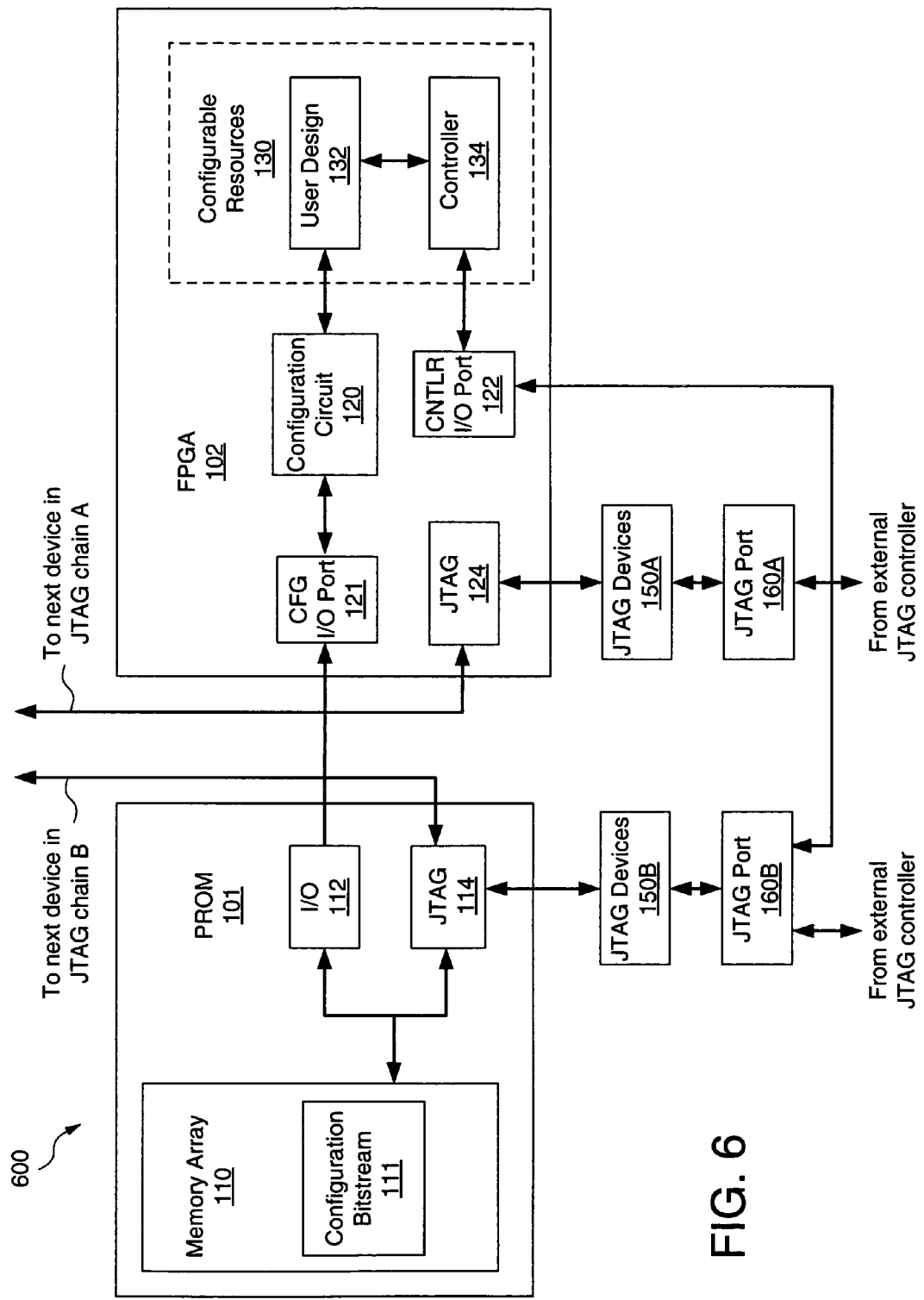
FIG. 6 is an exemplary block diagram of system having a PROM connected to an FPGA in accordance with other embodiments of the present invention.

FIG. 6 is a functional block diagram of a programmable system 600 in accordance with other embodiments of the present invention. System 600 includes PROM 101, FPGA device 102, one or more first JTAG devices 150A, one or more second JTAG devices 150B, a first system-level JTAG port 160A, and a second system-level JTAG port 160B. As depicted in FIG. 6, FPGA 102, first JTAG devices 150A, and first JTAG port 160A form a first boundary scan chain A, and PROM 101, second JTAG devices 150B, and second JTAG port 160B form a second boundary scan chain B that is separate from the first boundary scan chain A. The operation of system 600 is similar to that described above with respect to FIG. 1, except that the FPGA's controller I/O port 122 is coupled to the second JTAG port 160B so that PROM 101 may be accessed by the FPGA's controller 134 via the second boundary scan chain B. When the FPGA controller 134 is reading from and/or writing to the PROM memory array 110 using JTAG commands provided to the PROM 101 via the second boundary scan chain B, the external controller coupled to JTAG port 160B may tri-state its signal connections to JTAG port 160B so that controller 134 may utilize the second boundary scan chain B to directly access individual storage locations in the PROM memory array 110.

Figure 7:
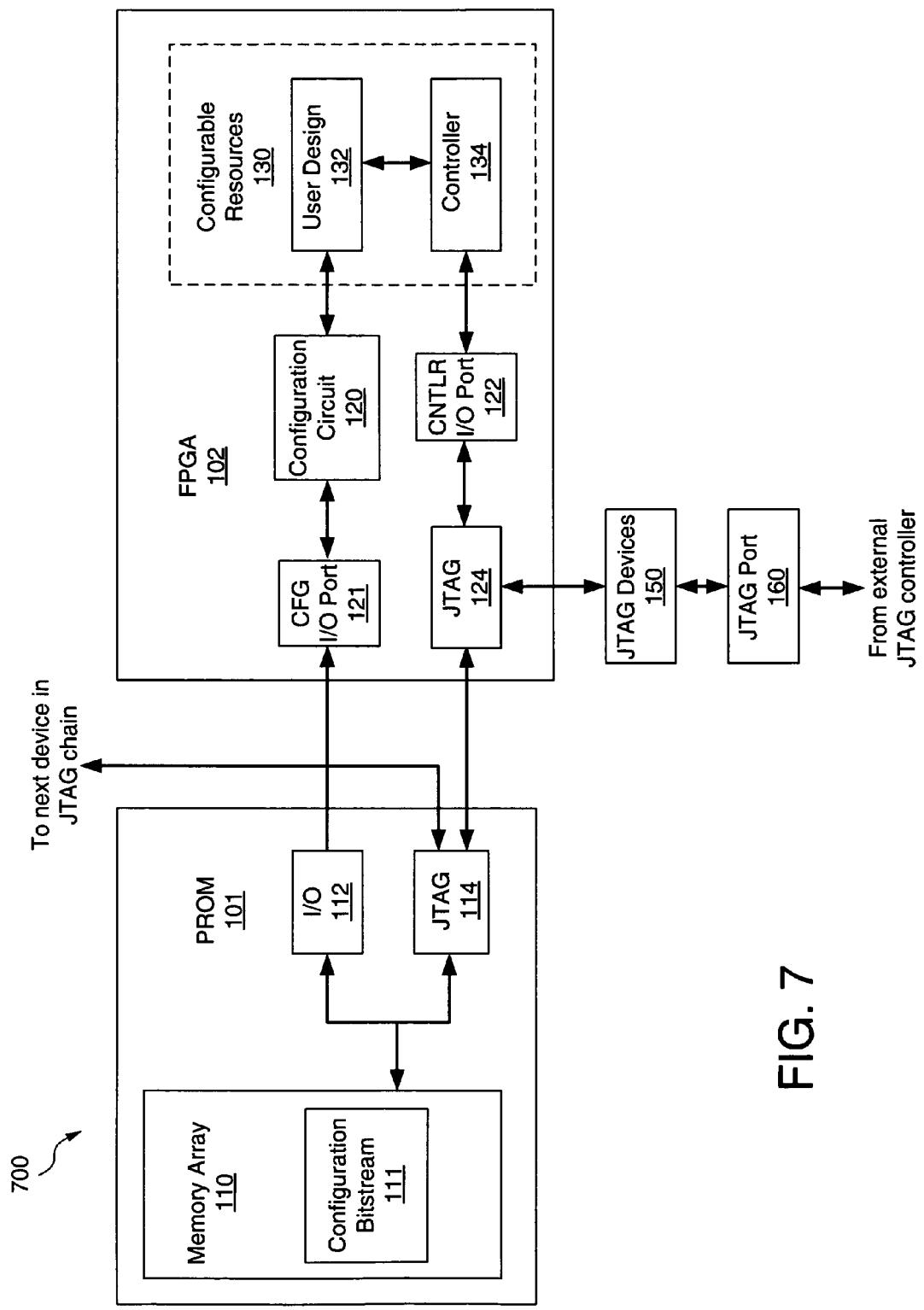
FIG. 7 is an exemplary block diagram of system having a PROM connected to an FPGA in accordance with yet other embodiments of the present invention.

FIG. 7 is a functional block diagram of a programmable system 700 in accordance with still other embodiments of the present invention. System 700 includes PROM 101, FPGA device 102, one or more JTAG devices 150, and JTAG port 160. The operation of system 700 is similar to that described above with respect to FIG. 1, except that the FPGA's controller I/O port 122 is coupled directly to the FPGA's JTAG circuit 124, which may allow controller 134 to directly access individual storage locations in the PROM memory array 110 without using the system's boundary scan chain.

While particular embodiments of the present invention have been shown and described, it will be obvious to those skilled in the art that changes and modifications may be made without departing from this invention in its broader aspects, and therefore, the appended claims are to encompass within their scope all such changes and modifications as fall within the true spirit and scope of this invention.

What is claimed is:

1. A method of updating data stored in a memory for use with a configurable integrated circuit (IC) device, the method comprising:
    programming first data into the memory,
    the first data including configuration data for configuring the configurable IC device and user data;
    wherein the programming the first data into the memory is via an input/output (I/O) port of the memory, and individual storage locations of the memory cannot be individually accessed via the I/O port;
    marking the first data as valid;
    configuring the configurable IC device with the first data;
    programming second data into the memory without erasing the first data using a controller implemented in the configurable IC device,
    the second data including updated user data for updating user data in the first data;
    marking portions of the first data corresponding to user data being updated as stale; and
    marking the second data as valid;
    wherein the programming the second data into the memory, the marking portions of the first data, and the marking the second data are via a boundary scan port of the memory and individually access individual storage locations of the memory;
    wherein the portions of the first data marked as stale are only erasable by a chip-erase function.

2. The method of claim 1, wherein the memory comprises a plurality of storage locations that are not individually erasable.

3. The method of claim 1, wherein the memory comprises a plurality of storage locations, at least one of which comprises:
    a status page comprising a number of status bits that indicate whether data stored therein is valid or stale.

4. The method of claim 3, wherein:
    marking the first data as valid comprises programming a first of the status bits in a corresponding storage location; and
    marking the first data as stale comprises programming a second of the status bits in the corresponding storage location.

5. The method of claim 4, wherein programming the second data comprises:
    sending JTAG commands from the configurable IC device to the memory to access any number of storage locations in the memory.

6. The method of claim 5, further comprising:
    selectively reading data from the memory into the configurable IC device in response to the status bits.

7. The method of claim 4, further comprising:
    storing a start address of user data stored in the memory into the status page of a selected storage location in the memory;
    wherein programming the second data comprises:
        reading the start address from the selected storage location in the memory;
        examining the status bits of the storage location in the memory identified by the start address; and
        determining whether the storage location identified by the start address is available for storing new data in response to the examining.

8. The method of claim 7, wherein programming the second data further comprises:
    selectively incrementing the start address in response to the determining.

9. The method of claim 1, wherein configuring the configurable IC device with the first data comprises:
    configuring one or more configurable resources in the configurable IC device using a portion of the first data to implement the controller.

10. The method of claim 1, wherein the memory is a programmable read-only memory (PROM), and the configurable IC is a programmable logic device (PLD).

11. A system comprising:
    means for storing data having first data stored in a first number of first storage locations, the first data for configuring a configurable integrated circuit (IC);
    wherein the means for storing first data includes an input/output (I/O) port of a memory, and individual storage locations of the memory cannot be individually accessed via the I/O port;
    means for programming second data into a second number of second storage locations in the means for storing without erasing the first data;
    means for marking selected portions of the first data as stale;
    means for erasing all of the storage locations in the means for storing data using a chip-erase function; and
    means for marking the second data as valid;
    wherein the means for programming the second data into the memory, the means for marking portions of the first data, and the means for marking the second data include a boundary scan port of the memory, and individually access individual storage locations of the memory.

12. The system of claim 11, wherein the storage locations in the means for storing are not individually erasable.

13. The system of claim 11, wherein at least one of the storage locations includes a status page comprising a number of status bits that indicate whether data stored therein is valid or stale.

14. The system of claim 13, wherein:
    the means for marking the selected portions of the first data as stale comprises:
        means for programming a first of the status bits in a corresponding storage location; and the means for marking the second data as valid comprises:
    means for programming a second of the status bits in a corresponding storage location.
15. The system of claim 11, further comprising:
    means for configuring one or more configurable resources in the configurable IC using a portion of the first data to implement a controller; and
    means for sending commands from the controller to the means for storing to directly address individual storage locations in the means for storing.
16. The system of claim 11, wherein the means for storing comprises a programmable read-only memory (PROM) and the configurable IC comprises a programmable logic device (PLD).
17. A system comprising:
    a memory device; and
    a configurable integrated circuit (IC);
    wherein the memory device comprises:
        a memory array having a number of first sub-blocks to store configuration data for configuring the configurable IC and having a number of second sub-blocks for storing user data for use by the configurable IC, wherein each of the second sub-blocks includes a status page for storing a number of status bits that indicate whether data stored therein is valid or stale,
        wherein the memory array is only erasable by a chip-erase function that erases the entire memory array;
        a first interface circuit coupled to the memory array, wherein individual storage locations of the first and second sub-blocks cannot be individually accessed via the first interface; and
        a boundary scan interface circuit coupled to the memory array; and
    the configurable IC comprises:
        a plurality of configurable resources for implementing one or more user designs embodied by the configuration data;
        a controller; and
        a second interface circuit coupled to the controller and to the boundary scan interface circuit, wherein the controller is configured to individually access individual storage locations of the second sub-blocks of the memory array via the boundary scan interface circuit.
18. The system of claim 17, wherein the controller is implemented by one or more of the plurality of configurable resources in response to the configuration data.
19. The system of claim 17 wherein the memory device is a programmable read-only memory (PROM) and the configurable IC is a programmable logic device (PLD).
20. The method of claim 1, further comprising:
    retrieving at least a subset of the portions of the first data marked as stale.

* * * * *